United States Patent [19]

Mak et al.

[11] Patent Number: 4,594,585
[45] Date of Patent: Jun. 10, 1986

[54] ELECTROMAGNETICALLY-CONTROLLED FLAT KNITTING MACHINE

[75] Inventors: Gerd Mak, Reutlingen; Jürgen Ploppa, Pfullingen, both of Fed. Rep. of Germany

[73] Assignee: H. Stoll GmbH and Company, Reutlingen, Fed. Rep. of Germany

[21] Appl. No.: 573,946

[22] Filed: Jan. 26, 1984

[30] Foreign Application Priority Data

Feb. 9, 1983 [DE] Fed. Rep. of Germany ....... 3304360

[51] Int. Cl.⁴ .............................. G08B 21/00
[52] U.S. Cl. ..................... 340/679; 364/551; 66/75.2; 371/20
[58] Field of Search ............... 340/679; 66/75.2, 219, 66/210; 364/470, 550, 551, 552, 146, 480, 481, 579; 371/20, 29; 324/205, 227

[56] References Cited

U.S. PATENT DOCUMENTS

| | | | |
|---|---|---|---|
| 3,766,539 | 10/1973 | Bradshaw et al. | 340/567 |
| 3,964,276 | 6/1976 | Nishio et al. | 340/679 |
| 4,058,316 | 11/1977 | Miller | 273/121 A |
| 4,088,988 | 5/1978 | Berger | 340/679 |
| 4,372,464 | 2/1983 | Otten | 194/10 X |
| 4,396,990 | 8/1983 | Weingartner et al. | 364/551 |
| 4,458,187 | 7/1984 | Heiman | 221/21 X |

Primary Examiner—James L. Rowland
Assistant Examiner—Jeffery A. Hofsass
Attorney, Agent, or Firm—Erwin S. Teltscher

[57] ABSTRACT

An electromagnetically-controlled flat knitting machine has a supervising system for checking the functional readiness of a setting magnet of the machine. The supervising system comprises a microprocessor with a detecting and signalling device, and a detector for measuring closed and open circuits. Such measurements are collected periodically from the microprocessor through an intermediate unit and are signalled on the signalling device. The individual setting magnets can be checked for functional readiness both in the case of a stationary as well as a running machine without these having to be specially actuated (i.e. energized) for this purpose. To this end, a direct voltage of an intensity less than the response voltage of the winding thereof is applied to the setting magnet concerned. A measuring resistance is arranged in a conductor to the setting magnet energized by the auxiliary direct voltage, and the aforesaid intermediate unit is connected to an analogue to digital converter whose input is connected to the measuring resistance.

6 Claims, 1 Drawing Figure

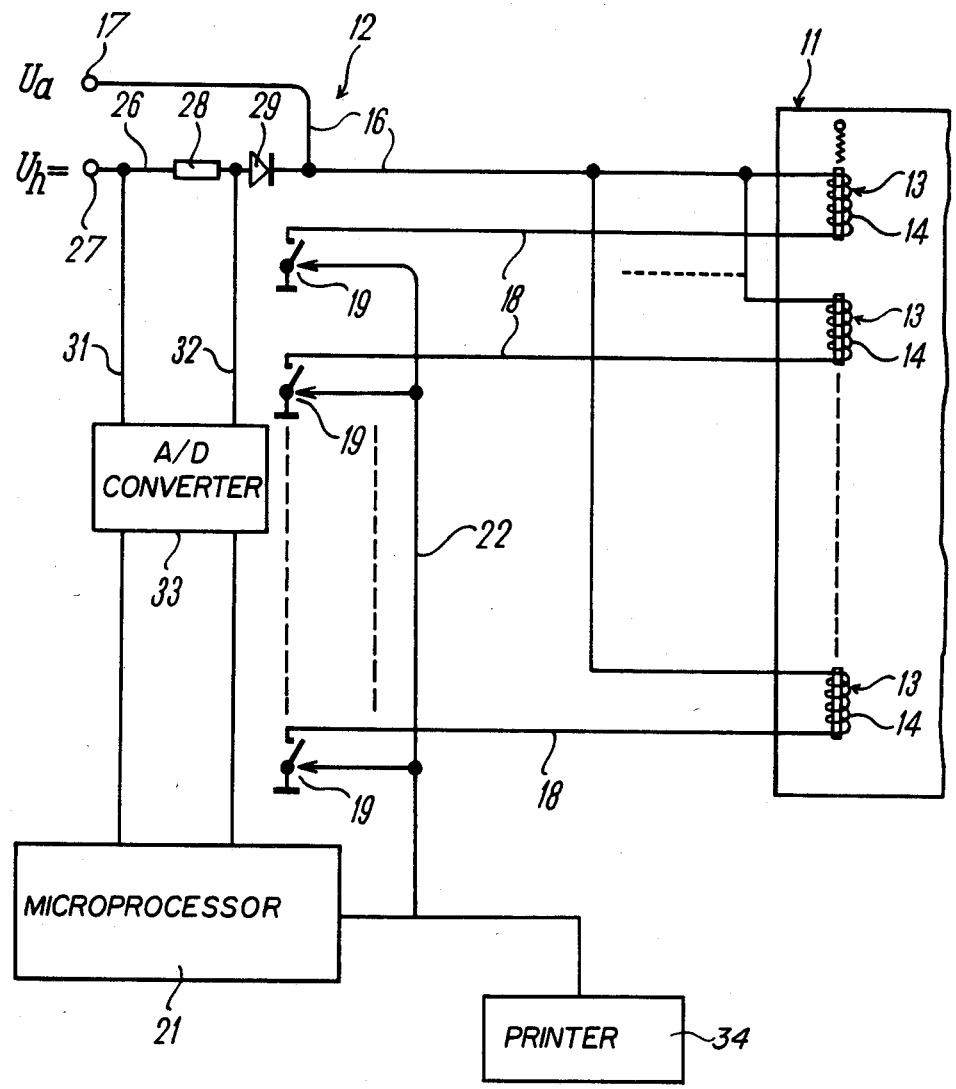

ELECTROMAGNETICALLY-CONTROLLED FLAT KNITTING MACHINE

The present invention relates to an electromagnetically controlled knitting machine, particularly a flat knitting machine.

Conventionally, such a knitting machine can have a supervising arrangement for checking the functional readiness of setting magnets thereof, the supervising arrangement being composed of a microprocessor with a detecting and signalling device, and means for measuring short and open circuits and for extracting the measurement from the microprocessor periodically through an intermediate unit and showing it on the associated signalling device. A knitting machine of this general type is disclosed in German Patent Specification No. 29 39 736, wherein a series of pulses are applied successively to the setting magnets, the frequency of these pulses corresponding to the function of the magnets.

In this conventional machine, the switching on and/or off of the setting magnets is checked with the help of the series of pulses by activating the windings of the magnets. The individual setting magnets have different functions depending on their use, for example for thread guides, for pre-selectors, for actuation of butts, and so on. In other words, during starting and stopping individual setting magnets move their associated mechanical parts both forwards and back, others move the associated parts back only, and yet others move the parts forward only; also, the forward and back movement of some setting magnets can be idle, that is to say they do not effect movement of an associated mechanical part. This means that when the setting magnets are checked for the two last-mentioned functions with the help of the known supervising arrangement, the associated mechanical part of the machine is moved in one direction only. Since such movement of the associated mechanical part cannot be reversed electromagnetically and has to be performed mechanically only after a carriage stroke, this means that only those setting magnets which have to be activated for the next type of activity, or which have already been activated, can be checked. This is disadvantageous because one has either to combine the checking of all the setting magnets with subsequent mechanical restoration, which takes time, or one must check the individual magnets during a working phase of the machine and not as a preliminary operation.

It is therefore an object of the present invention to provide an electromagnetically-controlled knitting machine, and in particular a flat knitting machine of the kind first set forth, in which the functional readiness of the individual setting magnets can be checked without them having to be activated for this purpose, both when the machine is stationary and when it is running.

The invention achieves this object by applying to the setting magnet an auxiliary direct voltage (a checking voltage) whose intensity is less than the response voltage of the magnet, by including in the aforesaid detecting device a measuring resistance which is arranged in a measurement conductor to the magnet and by providing the aforesaid intermediate unit in the form of an analogue to digital converter having an input terminal which is connected to the measuring resistance.

In this way, it is not necessary to activate the setting magnets so that the latter do not operate or move the associated mechanical parts of the knitting machine, because the checking voltage applied to the magnet is less than the response voltage thereof. This means that it is possible very simply to check, as far as possible whether there is any break or short circuit in the conductors from and to the setting magnets or in the windings of these magnets, and to check also that these windings are of the correct electrical capacity. Moreover, such checking can be performed not only selectively during the working of the machine, but also in toto before the machine is started. This enables the circuitry of the checking arrangement to be simplified, also because a simple measuring resistance is adequate to provide a measurement tracer or scanner at which the voltage drop can be detected and measured and through which the current produced by the applied auxiliary voltage is passed. It is then sufficient to transmit this measured value to the microprocessor through an analogue to digital converter.

Advantageously the auxiliary direct voltage is fed to the conductor for supplying the energizing or response voltage for the individual setting magnet or a group of such magnets. In this case the conductor incorporating the measuring resistance is connected through a blocking diode with the aforesaid supply conductor to the setting magnets.

The invention will now be further described, by way of example only, with reference to the single FIGURE of the accompanying drawing, which is a diagram of an electromagnetically-controlled flat knitting machine constructed in accordance with the present invention.

The illustrated flat knitting machine is designated as 11 and is provided with a checking arrangement 12 used to monitor setting magnets 13 or groups of such magnets to determine whether they are functional. The illustrated setting magnets 13 are associated with needle pre-selection and will be pivoted when energized: however, it is to be appreciated that the invention may equally well be supplied to setting magnets associated with other mechanical parts of the machine, such as yarn guides and butt elements. Windings 14 of all the magnets 13 of like form in a group are connected through a common conductor 16 having an input terminal 17 to which there is applied during normal working (but not during the measuring phase) an activating voltage, that is to say a response or initiating voltage necessary to energise the setting magnets. Each of these windings 14 is connected through a separate return conductor 18 to a preferably electronic initiating switch 19, for example of zero potential. The initiating switches 19 are coupled to a microprocessor 21 through a conductor 22 which incorporates a detector field (not shown) and a press element (also not shown).

During operation of the flat knitting machine, the individual actuating switches 19 are closed to control the selected setting magnets in accordance with data stored in the microprocessor 21. This means that there has to be in the microprocessor 21 a positive co-ordination with the individual setting magnets. For this purpose, at the terminals of a measuring resistance 28 two conductors 31 and 32 leading to an analogue to digital converter 33 are connected to the microprocessor 21.

The above-described arrangement 12 functions as follows. Either before the knitting machine 11 performs a working operation or while such an operation is in progress, an auxiliary direct voltage Uh is applied to a measuring conductor 16 only, that is to say any voltage applied at this time to the terminal 17 is cut off. The microprocessor 21 then initiates in sequence an examination of the individual checking magnets 13 by actuating in turn the individual energizing switches 19 in accordance with their association with the relevant magnet 13. The resultant voltage drop is transmitted to the analogue to digital converter 33 which converts same to a digital value and forwards this to the microprocessor for processing, for correlation with the setting magnet involved for display.

If the magnet 13 concerned is functionally capable and ready, this will produce a voltage drop dependent on the type of magnet so that the microprocessor will signal that this setting magnet is in order. Should there be a short-circuit in the feed conductor 16 in the plug-in connections, or in the winding of a setting magnet that has already been checked, this will produce a larger potential drop at the measuring resistance 28 so that the microprocessor will provide a comparison with the normal measuring value indicating the short-circuit. If there is a broken connection in the supply conductor 16, in the plug-in connections, and/or in the winding of the relevant setting magnet 13, then the measuring current and thus the voltage drop at the measuring resistance 28 will be zero: the microprocessor 21 will note this and signal by comparison with the normal measurement value that there is an open circuit.

Thus by means of the measurement detector formed by the resistance 28, the microprocessor 21 includes means for signaling operative data, such as "short-circuit" and "open circuit" conditions of the setting magnet or magnets under test, and can process calculate and display the existing value and the proper target values appropriate to the magnet concerned, such as impedance and a characteristic curve of the winding 14 of the setting magnet on a printer 34 connected to the microprocessor 21. In addition, on the basis of the rate of voltage increase at the measuring point, the inductance of the magnet windings can be measured and checked by the microprocessor and an appropriate corrective measurement qualification (too small, too big, or correct) can be obtained from the microprocessor from the existing and the target values, and be signalled to, and displayed along with the checked and target values on the printer. This checking of the individual setting magnets 13 is performed in a voltage of the individual setting magnets so that the latter are not activated or set by the applied auxiliary voltage. Checking of the setting magnets can also be performed during operation of the knitting machine by briefly interrupting the voltage energization of the setting magnets and by applying the auxiliary voltage thereto during this period.

We claim:

1. In an electromagnetically-controlled knitting machine of the kind including electromagnetic means incorporating a setting magnet with a winding having a response voltage and supervising means for checking the functional readiness of said magnet, said supervising means including a microprocessor with a detecting and indicating device and a measuring tracer for closed and open circuits, measurements from said measuring tracer being transmitted in sequence through an intermediate unit for display by said detecting and indicating device, the improvement comprising means for applying to said setting magnet an auxiliary direct voltage of an intensity less than said response voltage of said winding of said setting magnet, the connection of said measuring tracer through a measuring conductor passing said auxiliary voltage to a measuring resistance connected to said setting magnet, wherein said intermediate unit includes an analog to digital converter having an input which is connected to said measuring resistance, and wherein the functional readiness of said setting magnet is defined by existing and target values, said microprocessor calculating said target values, and obtaining corrective values from said existing and said target values, and, signalling means indicating operative data on said detecting and indicating device, said operative data including an impedance and a characteristic curve of said setting magnet, and said existing and said target values, said corrective values being displayed on said signalling means.

2. The knitting machine according to claim 1, further comprising a supply conductor connected to said setting magnet and a diode in said connection between said setting magnet and said measuring conductor.

3. The knitting machine according to claim 2, further comprising means for interrupting the energizing voltage for said winding from said supply conductor.

4. The knitting machine according to claim 1, further comprising means for co-ordinating said auxiliary voltage supply with the type of construction and use of said setting magnet.

5. The knitting machine according to claim 1, wherein said detecting and indicating devices includes a printer.

6. The knitting machine according to claim 1, wherein the existing values include "short circuit" and "open circuit" conditions.

* * * * *